United States Patent
Floyd et al.

(10) Patent No.: US 7,629,850 B2
(45) Date of Patent: Dec. 8, 2009

(54) VARIABLE-GAIN IMAGE-REJECT LOW-NOISE AMPLIFIER

(75) Inventors: Brian Allan Floyd, Mahopac, NY (US); Scott Kevin Reynolds, Amawalk, NY (US)

(73) Assignee: International Busines Machines Corporation, Armonk, NY (US)

(*) Notice: Subject to any disclaimer, the term of this patent is extended or adjusted under 35 U.S.C. 154(b) by 2 days.

(21) Appl. No.: 12/127,379

(22) Filed: May 27, 2008

(65) Prior Publication Data

US 2009/0015335 A1 Jan. 15, 2009

Related U.S. Application Data

(60) Provisional application No. 60/949,685, filed on Jul. 13, 2007.

(51) Int. Cl.
*H03G 3/30* (2006.01)
(52) U.S. Cl. .................................. 330/285; 330/284
(58) Field of Classification Search ................ 330/311, 330/98, 278, 284, 282
See application file for complete search history.

(56) References Cited

U.S. PATENT DOCUMENTS

| | | | |
|---|---|---|---|
| 6,118,338 A | 9/2000 | Frank et al. | |
| 6,144,254 A | 11/2000 | Irvine et al. | |
| 6,172,566 B1 | 1/2001 | Nguyen | |
| 6,175,274 B1 | 1/2001 | Groe | |
| 6,211,729 B1 | 4/2001 | Morkner et al. | |
| 6,392,487 B1 * | 5/2002 | Alexanian | 330/254 |
| 6,522,195 B2 | 2/2003 | Watanabe et al. | |
| 6,724,259 B2 * | 4/2004 | Tanabe | 330/285 |
| 2002/0053947 A1 | 5/2002 | Macedo | |

OTHER PUBLICATIONS

S. Reynolds et al., "A Direct-Conversion Receiver IC for WCDMA Mobile Systems", Proc. 2002 Bipolar/BiCMOS Circuits and Technology Meeting, Sep. 2002, p. 61-64.
S. Reynolds et al., "A Direct-Conversion Receiver Integrated Circuit for WCDMA Mobile Systems", IBM J. Res. & Dev., Mar./May 2003, p. 337-363, vol. 47 No. 2/3.

* cited by examiner

*Primary Examiner*—Robert Pascal
*Assistant Examiner*—Hieu P Nguyen
(74) *Attorney, Agent, or Firm*—Anne V. Dougherty; Ryan, Mason & Lewis, LLP

(57) ABSTRACT

A variable-gain amplifier includes an intermediate node operative to receive an electric current from a current source. A common-emitter amplifier has a collector electrically connected to the intermediate node. A first common-base amplifier has an emitter electrically connected to the intermediate node and a collector electrically connected to an output node. A base-degenerated amplifier has an emitter electrically connected to the intermediate node and a collector electrically connected to the output node. A second common-base amplifier has an emitter electrically connected to the intermediate node and a collector electrically connected to small-signal ground. The intermediate node is operative to direct the electric current to the first common-base amplifier, thereby causing the variable-gain amplifier to operate in a first mode; and the intermediate node is operative to direct the electric current to the base-degenerated amplifier and the second common-base amplifier, thereby causing the variable-gain amplifier to operate in a second mode.

23 Claims, 10 Drawing Sheets

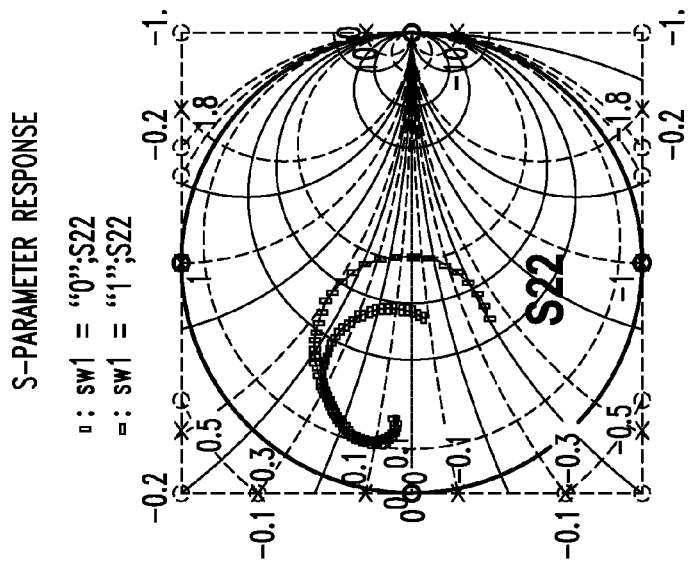
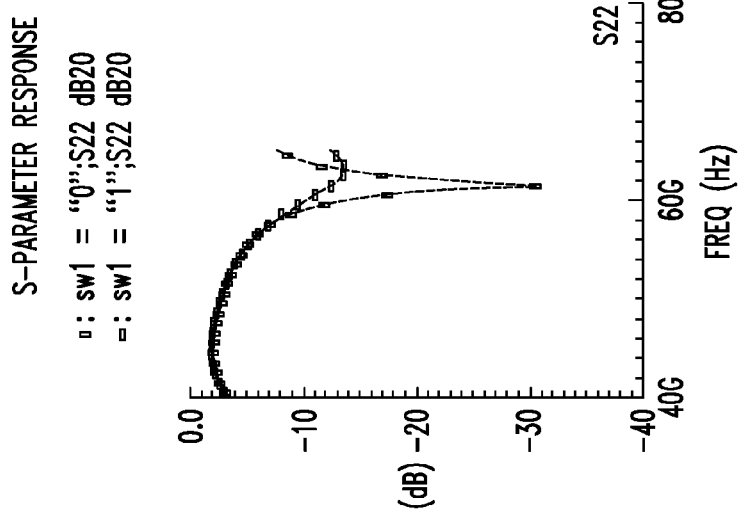
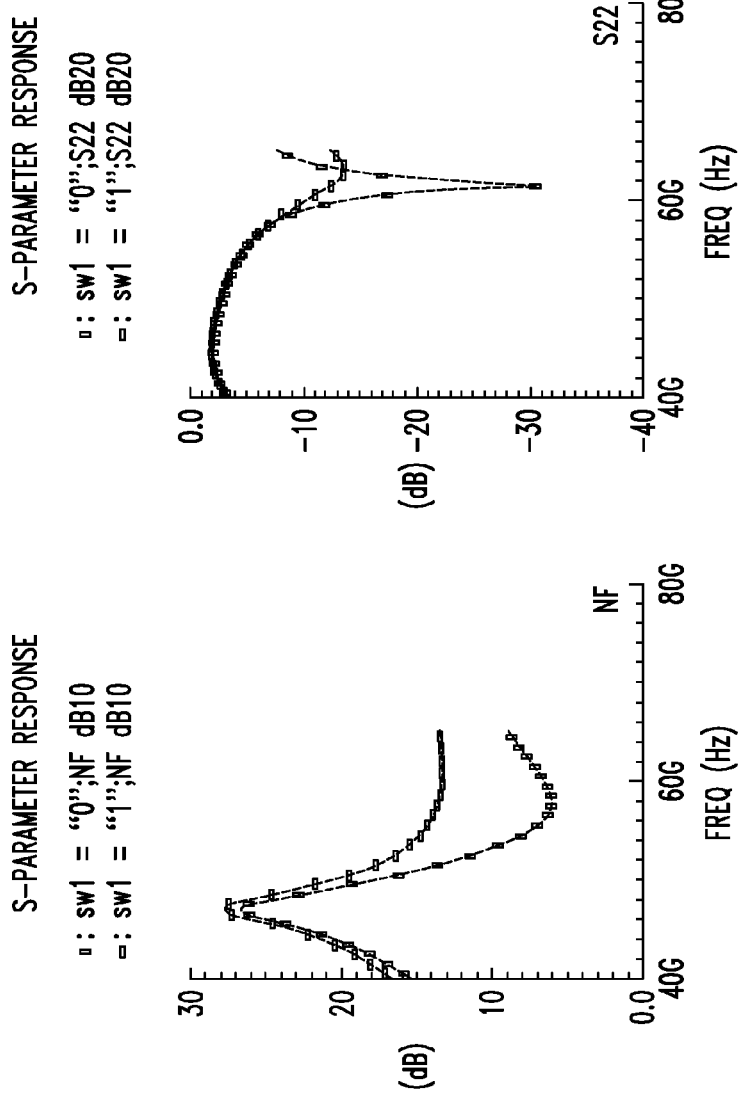
FIG. 8d
FIG. 8e
FIG. 8f

VARIABLE-GAIN IMAGE-REJECT LOW-NOISE AMPLIFIER

CROSS-REFERENCE TO RELATED APPLICATION

This application claims the benefit of U.S. Provisional Application No. 60/949,685, filed Jul. 13, 2007, the disclosure of which is incorporated by reference herein.

STATEMENT REGARDING FEDERALLY SPONSORED RESEARCH OR DEVELOPMENT

The invention disclosed herein was made with U.S. Government support under Contract Nos. N66001-02-C-8014 and N66001-05-C-8013 awarded by the Defense Advanced Research Projects Agency (DARPA). The Government has certain rights in this invention.

FIELD OF THE INVENTION

The invention relates to the design and implementation of receivers, and more specifically to the design and implementation of variable-gain amplifiers.

BACKGROUND OF THE INVENTION

A critical performance metric of any receiver is its dynamic range, equal to the ratio between the largest signal and smallest signal which the receiver can detect. The largest detectable signal is set through receiver linearity, where one or more stages in the receiver enter a non-linear mode of operation, introducing distortion. The smallest detectable signal is set through receiver sensitivity, which in turn is set through receiver noise figure. Large dynamic ranges, on the order of 50 dB or higher, are desirable, allowing the receiver to operate over a variety of input signal conditions. Therefore, a low noise figure is required together with high input linearity.

Being the first active receiver circuit after the antenna, the low-noise amplifier (LNA) is a critical building block for radio transceivers, impacting both ends of dynamic range. To improve receiver sensitivity or reduce receiver noise figure, the LNA is required to have high power gain and low-noise figure. The high power gain deemphasizes noise contributions further downstream in the receiver. To improve receiver linearity, however, the LNA should have low power gain, since the total receiver linearity is often set by the downconversion mixers. Lower gain in front of the mixer means that a higher input signal level can be processed before the mixer enters the nonlinear regime.

From this simple discussion, it can be seen that achieving high receiver dynamic range requires both high LNA power gain to improve receiver sensitivity and low LNA power gain to improve receiver linearity. Since these requirements contradict one another, the LNA is often designed to have moderate power gain to balance both sensitivity and linearity requirements. A better solution, though, is to have an LNA which can switch between high and low power gain modes, depending on the strength of the received input signal. Such an LNA is known as a switched-gain LNA. The high-gain mode of operation for the LNA is selected when the input signal level is small and close to the noise floor. The low-gain mode of operation for the LNA is selected when the input signal level is large and far from the noise floor.

One important design criteria for a switched-gain LNA is impedance matching at input and output nodes for both high-gain and low-gain conditions. Impedance matching is required at the input node for maximum power transfer, since the LNA input arrives from off chip. Impedance matching at the output node is not required if the LNA output is physically located very close (<5% of a wavelength) to the input of the following stage. If the LNA and the following stage are not close together, meaning that the signal traverses a distance which is a significant portion (>5-10%) of the wavelength, then output impedance matching is required. This occurs at low frequencies (e.g., 2 GHz) if the LNA output goes off chip. This also occurs at millimeter-wave frequencies (e.g., 60 GHz) for the on-chip connection between the LNA and the following downconversion mixer.

In summary, the switched-gain LNA requires a mechanism to switch between high and low power gains while also having nearly constant input and output impedance matching in both modes of operation. Additionally, the switched-gain LNA should have an input-referred linearity which improves in the low-gain mode such that the LNA does not limit receiver linearity. Finally, it is desirable to have the ability to adjust the value of the power gain in low-gain mode to realize a variable-gain amplifier function at radio frequencies (RF).

SUMMARY OF THE INVENTION

An exemplary variable-gain amplifier includes an intermediate node operative to receive an electric current from a current source. A common-emitter amplifier has a collector electrically connected to the intermediate node. A first common-base amplifier has an emitter electrically connected to the intermediate node and a collector electrically connected to an output node. A base-degenerated amplifier has an emitter electrically connected to the intermediate node and a collector electrically connected to the output node. A second common-base amplifier has an emitter electrically connected to the intermediate node and a collector connected to small-signal ground. The intermediate node is operative to direct the electric current to the first common-base amplifier, thereby causing the variable-gain amplifier to operate in a first mode; and the intermediate node is operative to direct the electric current to the base-degenerated amplifier and the second common-base amplifier, thereby causing the variable-gain amplifier to operate in a second mode.

Another illustrative embodiment of the present invention includes a receiver comprising at least one variable-gain amplifier as described above. A further illustrative embodiment of the present invention includes a design structure embodied in a machine readable medium, the design structure comprising a variable-gain amplifier as described above.

An exemplary method of operating a variable-gain amplifier includes steps of receiving an electric current at an intermediate node and determining one of a plurality of modes in which the variable-gain amplifier should operate. Responsive to a determination that the variable-gain amplifier should operate in a first mode, the electric current is directed from the intermediate node to a first common-base amplifier. The first common-base amplifier has an emitter electrically connected to the intermediate node and a collector electrically connected to an output node. Responsive to a determination that the variable-gain amplifier should operate in a second mode, the electric current is directed from the intermediate node to a base-degenerated amplifier and a second common-base amplifier. The base-degenerated amplifier has an emitter electrically connected to the intermediate node and a collector electrically connected to the output node. The second common-base amplifier has an emitter electrically connected to the intermediate node and a collector electrically connected to small-signal ground.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described herein in the context of an exemplary low-noise amplifier for use in a receiver. Although illustrative embodiments of the present invention may be particularly well-suited for use in a high-frequency and/or millimeter-wave receiver or transceiver, illustrative embodiments of the present invention may be used in a variety of contexts, including a broad range of communications, radar, and radiometry applications.

It is therefore to be understood that the techniques of the present invention are not limited to the methods and apparatus shown and described herein. Rather, alternative methods and apparatus within the scope of this invention will become apparent to those skilled in the art given the teachings herein.

Figure 1:
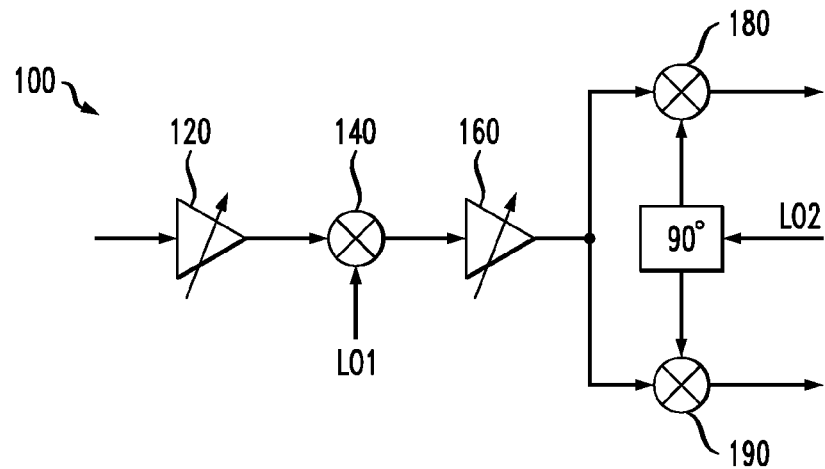
FIG. 1 shows a block diagram of a superheterodyne wireless receiver suitable for use with an exemplary low-noise amplifier according to an illustrative embodiment of the present invention.

FIG. 1 is a block diagram of an exemplary superheterodyne wireless receiver suitable for use with an illustrative embodiment of the present invention. Receiver 100 consists of low-noise amplifier 120, first downconversion mixer 140, intermediate-frequency amplifier 160, and a pair of second downconversion mixers 180 and 190. First downconversion mixer 140 receives first local oscillator signal LO1. Second downconversion mixers 180 and 190 receive local oscillator signal LO2 with a 90-degree rotation therebetween. Conventional aspects of receiver 100 and other receivers and/or transceivers suitable for use with an illustrative embodiment of the present invention are well-known to those skilled in the art.

Figure 2:
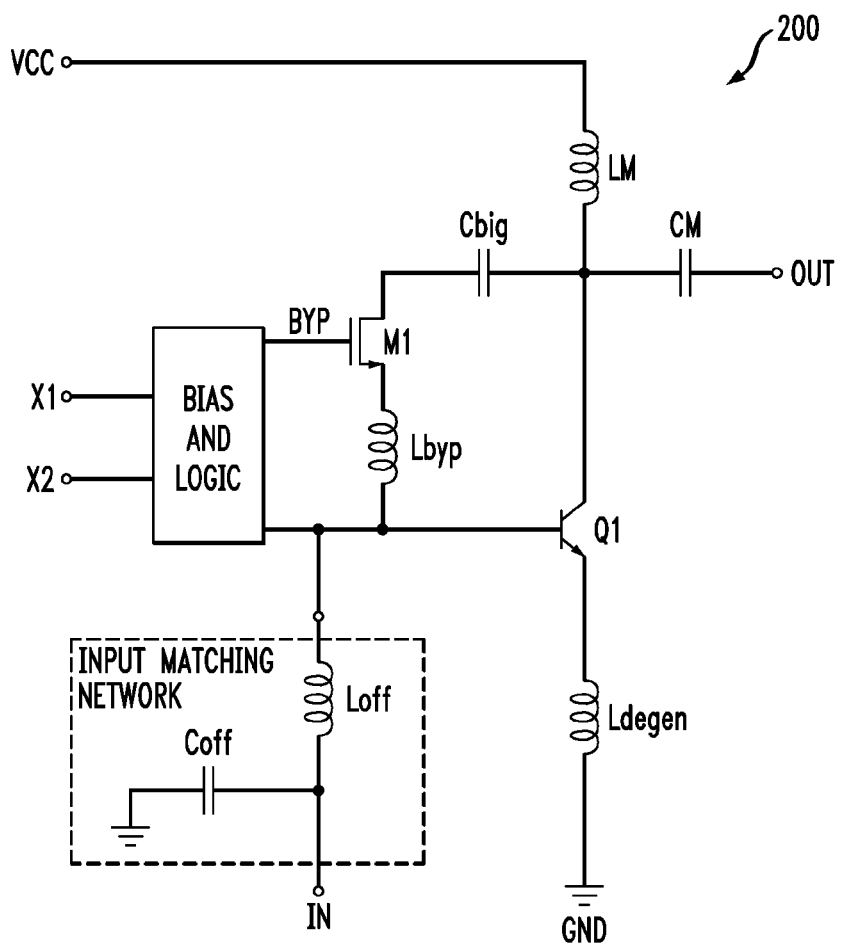
FIG. 2 shows a switched gain low-noise amplifier according to the prior art.

FIG. 2 shows a switched-gain LNA according to the prior art. Specifically, LNA 200 is similar to those described in, for example, S. Reynolds, et al., "A direct-conversion receiver IC for WCDMA mobile systems", Proc. 2002 Bipolar/BiCMOS Circuits and Technology Meeting, pp. 61-64, and U.S. Pat. No. 6,522,195, the disclosures of which are incorporated by reference herein.

In LNA 200, a single switch, M1, is used to implement the bypass around an amplifying common-emitter transistor Q1. In high-gain mode, amplification is provided by Q1 with inductive degeneration Ldegen. In bypass mode, Q1 is powered down and M1 is switched off, thus routing the signal from the input matching network through matching inductor Lbyp, bypass switch M1 and Cbig, to output matching network CM.

This topology consumes no power in the bypass mode, as device Q1 is powered down. Because LNA 200 is passive in bypass mode, its linearity is very high. However, in order for this amplifier to be matched in the bypass mode matching inductor Lbyp must be placed in series with bypass switch M1. However, inductor Lbyp can be large and therefore consumes valuable chip space.

Another drawback is that at millimeter-wave frequencies, bypass switch M1 is hard to realize in terms of implementing a switch which exhibits a high impedance ratio between off and on conditions. Namely, bypass switch M1 can have large parasitic capacitances which tend to make the switch never fully "on" or never fully "off" electrically.

Finally, this topology does not provide a mechanism to adjust the gain (attenuation) in the bypass mode. Instead, the gain in bypass mode is set by the insertion loss through the switch and matching networks.

Figure 3:
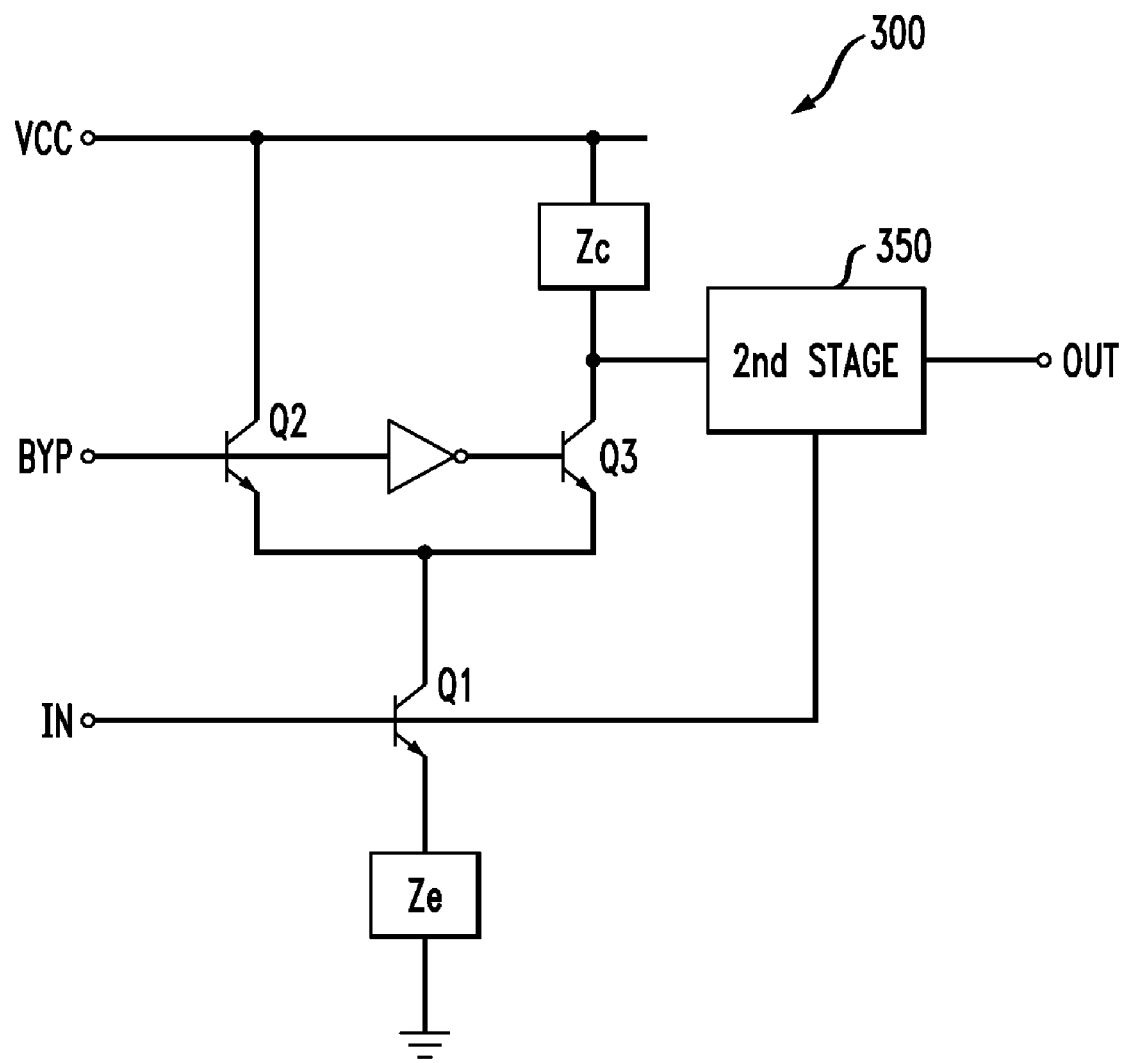
FIG. 3 shows another switched gain low-noise amplifier according to the prior art.

FIG. 3 shows another switched-gain LNA according to the prior art. Specifically, LNA 300 is similar to those described in, for example, U.S. Pat. Nos. 6,172,566; 6,175,274; and 6,144,254, the disclosures of which are incorporated by reference herein.

In LNA 300, current steering is used to realize a switched gain through the function of the cascode differential pair (Q2 and Q3). In high-gain mode (i.e., when BYP is low), Q3 is on and Q2 is off, allowing current generated by transconductor Q1 to be passed to output impedance load Zc and therein amplified. In bypass mode (i.e., when BYP is high), Q2 is on and Q3 is off, steering current generated by transconductor Q1 directly to VCC. Note that intermediate or variable gain can be achieved by only diverting a portion of Q1's current to VCC. LNA 300 also includes a second stage 350 which is switched in to provide a low-gain path from input IN to output OUT in bypass mode, similar to LNA 200. This second stage path requires passive components for matching purposes, and may contain one or more switches or transistors.

While LNA 300 provides a mechanism for adjustable gain, there are significant disadvantages associated therewith. If the second stage 350 is not present, then as the gain of the amplifier is reduced, the input-referred linearity of the amplifier is reduced by the same amount. Therefore, this form of variable-gain LNA does not necessarily improve the dynamic range of the receiver. Conversely, if the second stage 350 is present, then large passive components are required to impedance match the circuit in bypass mode, and once again, these passive components consume chip area.

An illustrative embodiment of the present invention implements a switched and variable-gain low-noise amplifier which is impedance matched to input and output in both the high-gain mode and low-gain modes. A cascode amplifier topology is used which consists of a common-emitter device connected to three or more common-base or "cascode" devices. A high-gain mode is achieved by enabling a first common-base amplifier, whose base terminal is connected to small-signal ground through a large bypass capacitor and whose collector terminal is connected to the output load. A low-gain mode is achieved by disabling the first common-base amplifier; enabling a second common-base amplifier, whose base terminal is connected to a small degeneration capacitance and whose collector terminal is connected to the output load; enabling a third common-base amplifier whose base terminal is connected to small-signal ground through a large bypass capacitor and whose collector terminal is connected directly to the supply voltage; and enabling a current source which provides direct current into the intermediate node of the cascode amplifier. Switched gain is achieved by selecting between the high and low gain modes. Variable gain is achieved in the low-gain mode by varying the value of the degeneration capacitor within the second common-base amplifier.

Figure 4:
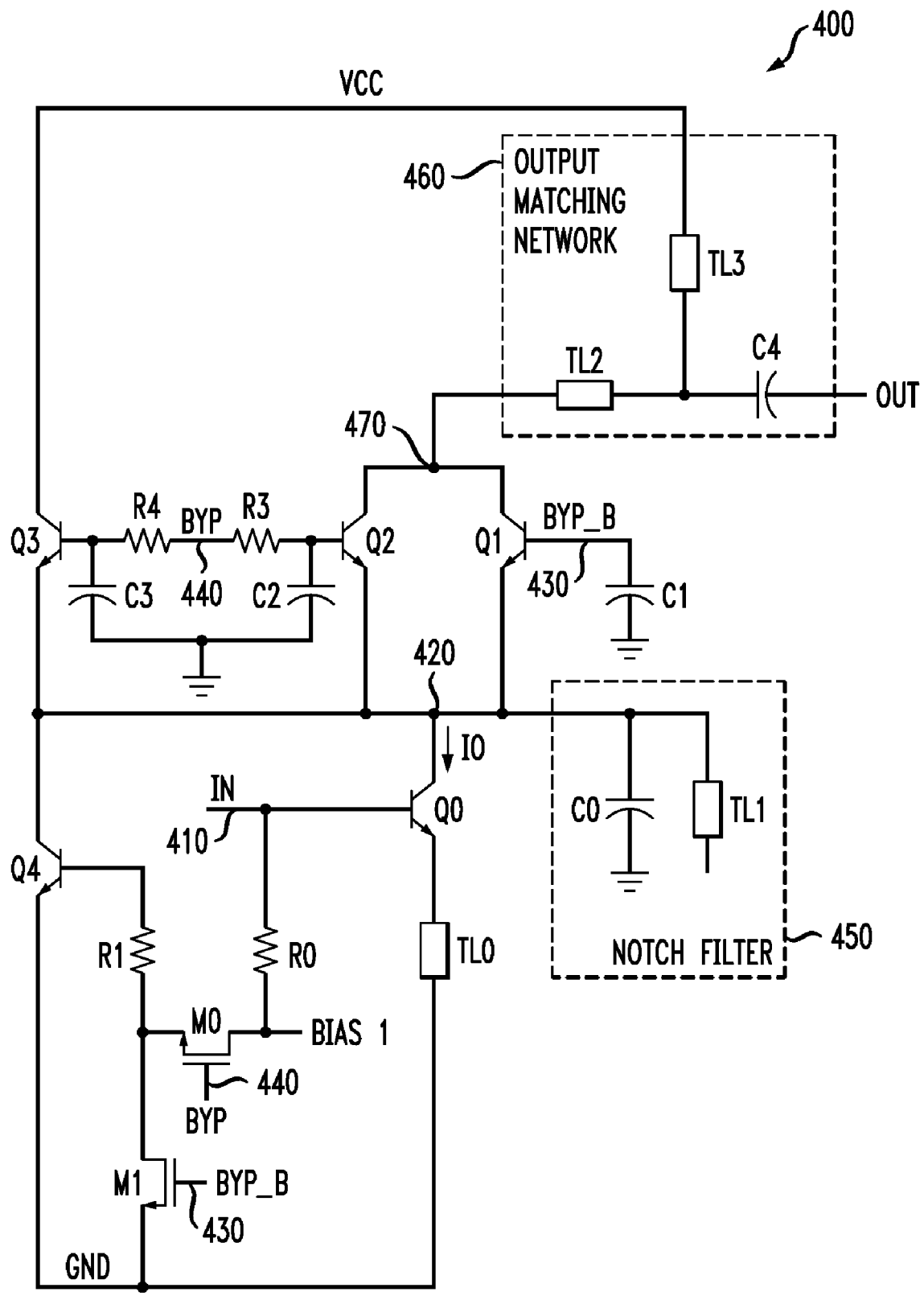
FIG. 4 shows an exemplary variable-gain amplifier according to an illustrative embodiment of the present invention.

FIG. 4 shows a schematic of exemplary switched and variable-gain low-noise amplifier 400, according to an illustrative embodiment of the present invention. Single-stage amplifier 400 comprises a common-emitter amplifier Q0 coupled to multiple cascode devices Q1, Q2, and Q3 at node 420 and a current source Q4 coupled to node 420. The collector nodes of Q1 and Q2 are coupled together at node 470 to output impedance matching network 460 consisting of series transmission line TL2, shunt transmission line TL3, and series capacitor C4. The collector node of Q3 is coupled directly to the supply, VCC.

When BYP node 440 is low and BYP_B node 430 is high, the amplifier is in the high-gain mode. Here, the collector current of Q0 is steered through Q1 whose collector is coupled to output matching network 460. Cascode device Q1 is configured as a common-base amplifier, where a large bypass capacitor C1 is attached to base node 430 of Q1, creating a small-signal ground at node 430. As a result, Q1 provides little to no attenuation of the input signal, and the circuit gain is at its maximum.

In high-gain mode, transistors Q2 and Q3 are disabled since BYP node 440 is low; therefore, the current through Q2 and Q3 are zero. Additionally, current source Q4 is disabled in high-gain mode. Specifically, the base node of current source Q4 is connected to ground through switch M1.

In high-gain mode, the quiescent current of Q0 and Q1 is set by the voltage at bias1, which is coupled to the base of Q0 through resistor R0. This quiescent current is labeled in FIG. 4 as I0.

When BYP node 440 is high and BYP_B node 430 is low, the amplifier is in the low-gain mode. Here, the collector current of Q0 is steered through Q2, whose output node 470 is coupled to output matching network 460, and Q3, whose output is coupled to VCC. Transistor Q1 is disabled in low-gain mode.

Cascode device Q2 is configured as a base-degenerated amplifier. This circuit behaves similarly to a common-base amplifier, except that now a very small capacitor (C2) in the base degenerates the amplifier and reduces the small-signal voltage gain. Capacitor C2 can either be a physical capacitor or a parasitic capacitor. Capacitor C2 is in series with the base-emitter capacitance of Q2, and this series combination behaves like a capacitive voltage divider, scaling the small-signal voltage on node 420 by an amount equal to C2/(2*C2+Cbe2). Very small values of C2 result in very low values of gain. Note that variable gain can be achieved by varying the value of C2.

Cascode device Q3 serves as a "dummy" load for common-emitter Q0. This ensures that the impedance seen looking into node 420 is roughly constant in both high-gain and low-gain modes, meaning that the voltage at node 420 is roughly constant as well. Without this "dummy" load, the higher impedance created by base-degenerated amplifier Q2 results in a small-signal voltage amplification at node 420. This voltage amplification counteracts the desired attenuation through device Q2. Alternately put, while the voltage gain of Q2 has been reduced through the use of capacitive degeneration, its current gain is unchanged. Device Q3, then, acts as a transimpedance, converting the small-signal current from Q0 into a small-signal voltage on node 420, which is then modified through the voltage gain of Q2.

By adding Q3 in low-gain mode, a current division occurs between Q2 and Q3. This is undesirable as it will affect the large-signal performance of the amplifier, e.g., the output-referred 1-dB compression point. The collector current I0 from Q0 will split equally between Q2 and Q3, since the base-emitter voltages of each transistor are equal; hence I0/2 flows in both Q2 and Q3. To retain the same output-referred large-signal performance of the amplifier, an additional current source is enabled in the low-gain mode such that the current through Q2 in low-gain mode equals the current through Q1 in high-gain mode. This is achieved by using current source Q4, which is matched in size to Q0, and which derives its bias voltage from node bias1. Specifically, the base node of current source Q4 is connected to node bias1 through switch M0, thereby enabling the current source to carry the same DC current as in Q0. Therefore, DC currents of I0 flow through transistors Q0 and Q4 and through transistors Q2 and Q3.

Additionally, an illustrative embodiment provides an on-chip image reject filter which provides the necessary image rejection in both high-gain and low-gain modes. Image-rejection is preferably obtained through the addition of a notch filter 450 at intermediate node 420 of the cascode. Notch filter 450 consists of a capacitor (C0) in parallel with an open-circuited transmission line (TL1). TL1 is a half-wavelength long at the notch frequency, realizing an effective short circuit at node 420 at the notch frequency. Capacitor C0 is used to resonate out the incremental inductance present at the RF frequency. Therefore, the notch filter exhibits a series resonance (low impedance) at the notch frequency, followed by a parallel resonance (high impedance) at the RF frequency. The parallel resonance at the RF frequency actually improves the performance of the cascode, since the parasitic capacitances of either Q1 or Q3 are absorbed into the resonant circuit. This eliminates any current division at node 420 and maximizes the achievable gain.

Once again, dummy transistor Q3 provided in the low-gain mode mimics the parasitics provided by Q1 in high-gain mode. This is necessary to retain the same frequency response for the image-reject filter, since notch filter 450 should be constantly loaded with the same parasitic capacitance at node 420.

Exemplary switched and variable-gain low-noise amplifier 400 advantageously causes the input and output impedance of the amplifier to be matched in both high-gain and low-gain modes. The nearly constant impedance provided at node 420 by either Q1 in high-gain mode or Q3 in low-gain mode results in nearly constant input impedance at input node 410.

At node 470, the output impedance of Q1 in high-gain mode can be different than the output impedance of Q2 in low-gain mode; however, the difference between these can be minimized through adding a shunt resistor to small-signal ground at node 470 to reduce the quality factor at this node.

Figure 5:
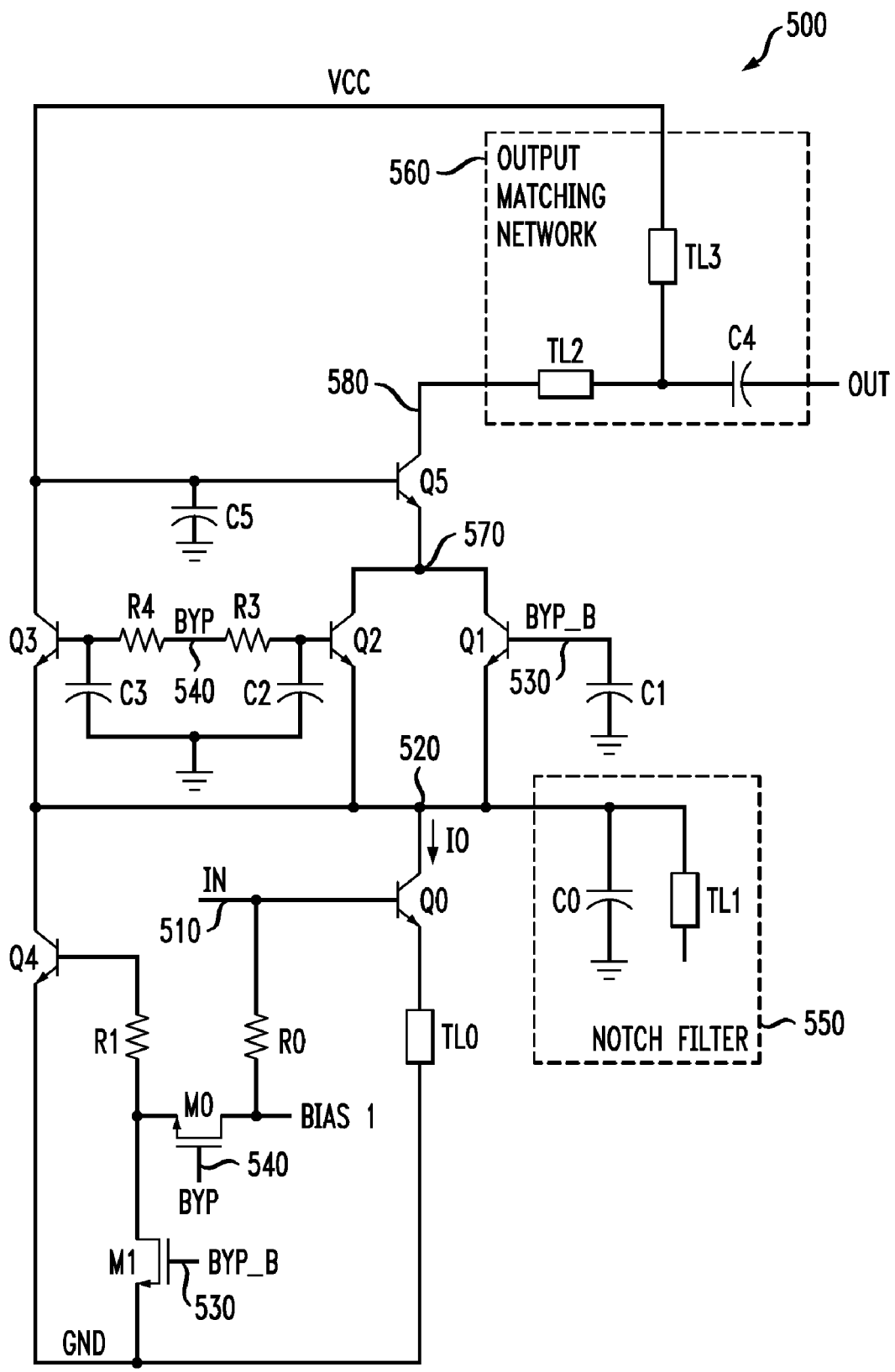
FIG. 5 shows an exemplary variable-gain amplifier according to another illustrative embodiment of the present invention.

FIG. 5 shows a schematic of exemplary switched and variable-gain low-noise amplifier 500, according to another illustrative embodiment of the present invention. Low-noise amplifier 500 in FIG. 5 is similar to low-noise amplifier 500 in FIG. 4 except that common-base amplifier Q5 has been inserted between nodes 570 and 580. Amplifier Q5 isolates the impedance at node 570 from the impedance at node 580, thereby resulting in constant output impedance for the amplifier in high-gain and low-gain modes. In other words, additional common-base amplifier stage Q5 has been added in series between devices Q1/Q2 and output matching network 560, in order to minimize the difference between output impedances in high-gain and low-gain modes.

Figure 6:
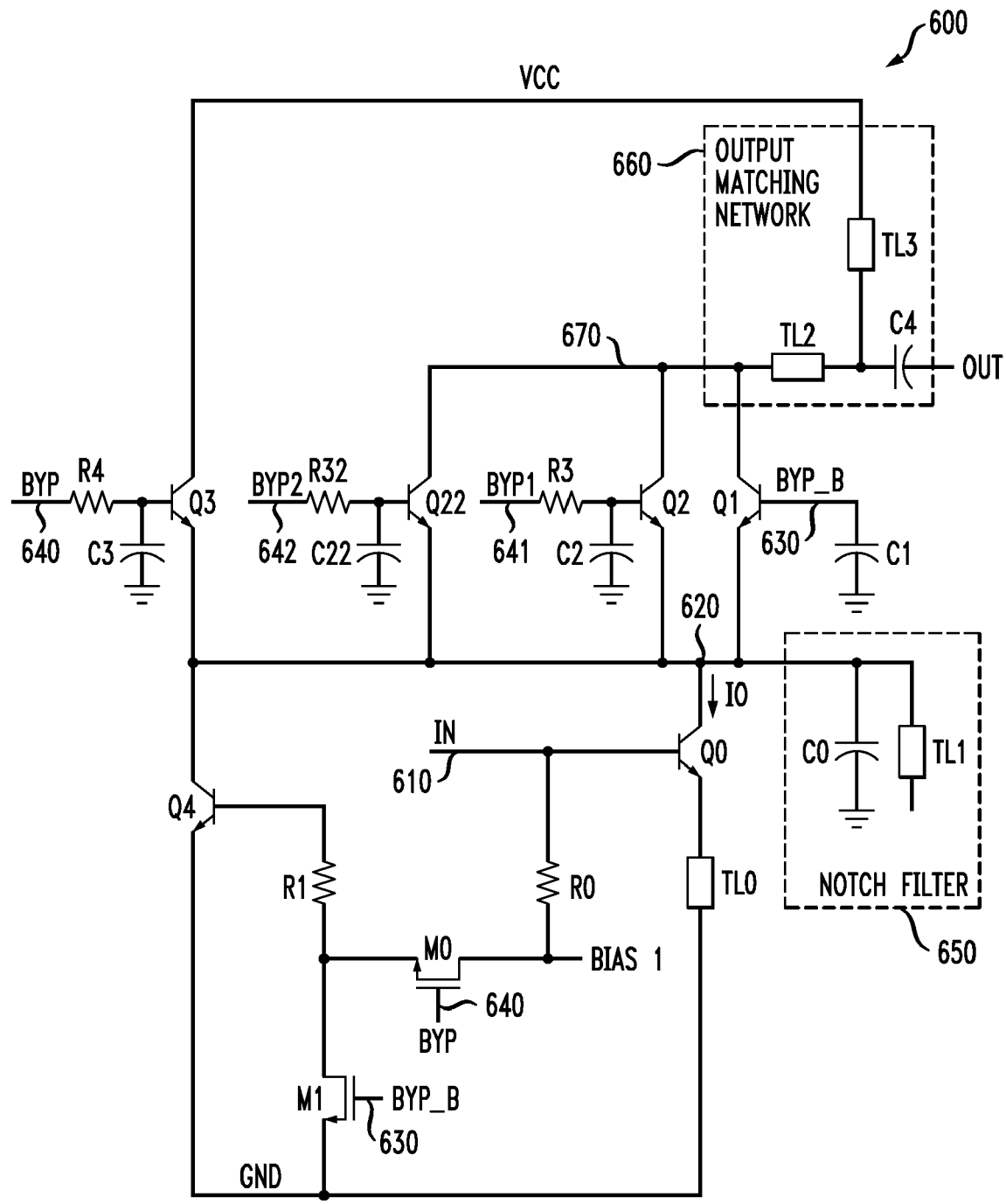
FIG. 6 shows an exemplary variable-gain amplifier according to a further illustrative embodiment of the present invention.

FIG. 6 shows a schematic of exemplary switched and variable-gain low-noise amplifier 600, according to a further illustrative embodiment of the present invention. Amplifier 600 allows additional low-gain modes to be achieved by substituting additional base-degenerated amplifiers with capacitive degeneration, while also enabling the third common-base amplifier whose collector terminal is connected directly to the supply voltage and the direct current source. Specifically, cascode device Q22 is added to provide an additional low-gain mode. Q22 is configured as a base-degenerated amplifier. A small capacitor C22 in the base of Q22 degenerates the common-base transistor and reduces the small-signal voltage gain. The value of capacitance for C22 is chosen to be different than the value of capacitance for C2, thereby providing an additional low-gain mode. Through tailoring the value of the degeneration capacitors C2 and C22, multiple gain values can be obtained within a single-stage amplifier.

When BYP node 640 is low, BYP1 node 641 is low, BYP2 node 642 is low, and BYP_B node 630 is high, the amplifier is in the high-gain mode. Here, current from Q0 is steered through device Q1. This is the same high-gain mode provided by amplifiers 400 and/or 500.

When BYP node 640 is high, BYP_B node 630 is low, BYP1 node 641 is high, and BYP2 node 642 is low, the amplifier is in the first low-gain mode. Here, current from Q0 is steered through devices Q2 and Q3 and current source Q4 is enabled. This is the same as the low-gain mode provided by amplifiers 400 and/or 500.

When BYP node 640 is high, BYP_B node 630 is low, BYP1 node 641 is low, and BYP2 node 642 is high, the amplifier is in the second low-gain mode. Here, current from Q0 is steered through devices Q22 and Q3 and current source Q4 is enabled. This is an additional low-gain mode not provided by amplifiers 400 and/or 500.

Finally, when BYP node 640 is high, BYP_B node 630 is low, BYP1 node 641 is high, and BYP2 node 642 is high, the amplifier is in the third low-gain mode. Here, current from Q0 is steered through devices Q2, Q22, and Q3 and current source Q4 is enabled. This is another additional low-gain mode not provided by amplifiers 400 and/or 500.

Figure 7:
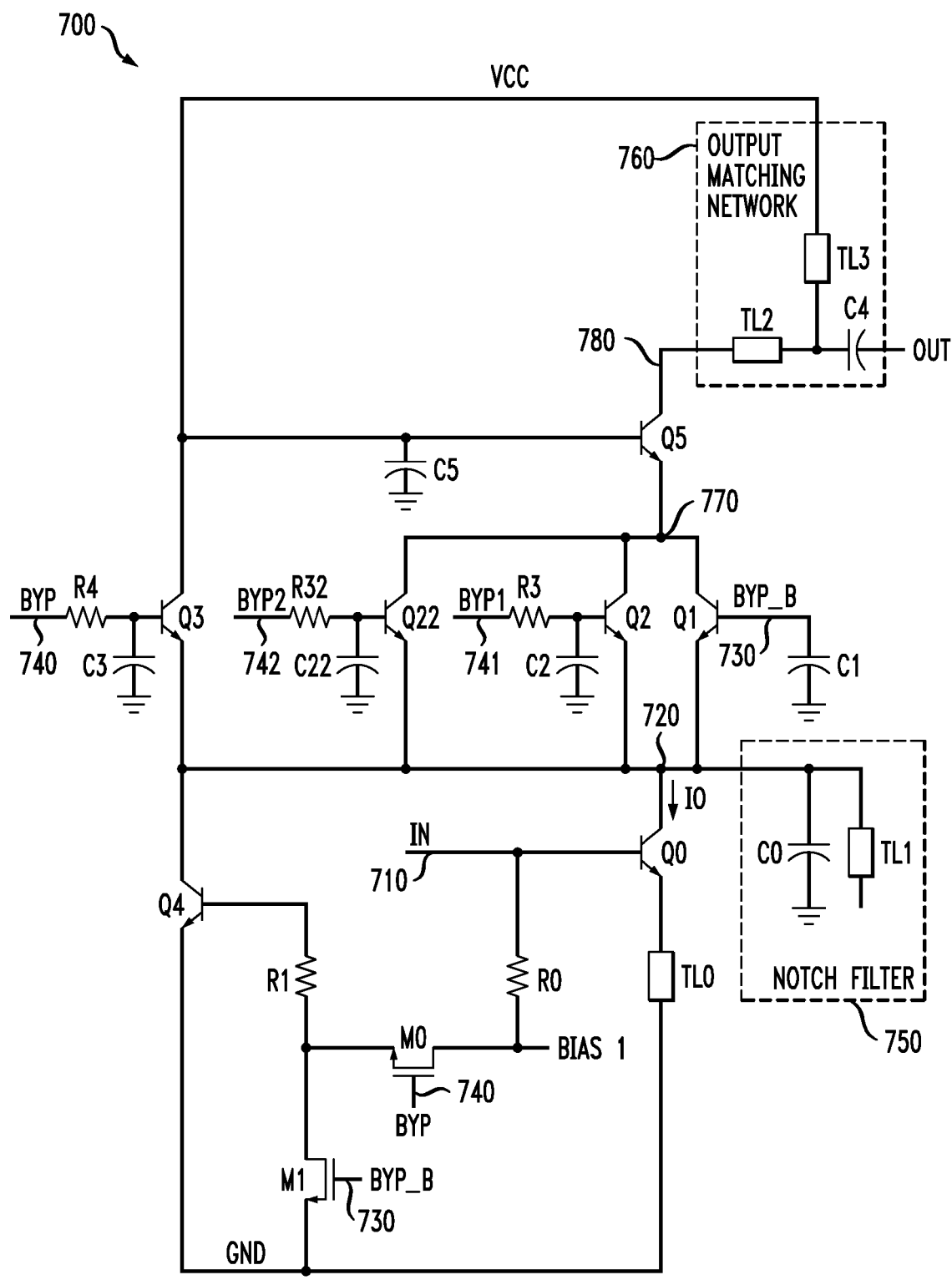
FIG. 7 shows an exemplary variable-gain amplifier according to a still further illustrative embodiment of the present invention.

FIG. 7 shows a schematic of exemplary switched and variable-gain low-noise amplifier 700, according to a still further illustrative embodiment of the present invention. Amplifier 700 implements the features described above with reference to FIG. 6 and the features described above with reference to FIG. 7.

Note that multiple amplifiers similar to 400, 500, 600 and/or 700 can be cascaded in series to realize additional gain and additional notch filters. For example, low-noise amplifier 120 in FIG. 1 may comprise one or more amplifiers similar to 400, 500, 600 and/or 700.

FIG. 8 shows the simulated small-signal performance of exemplary low-noise amplifier 400 in FIG. 4 in both high-gain and low-gain modes. This particular amplifier has been optimized for operation at a frequency of 60 GHz. The performance of the exemplary switched and variable-gain low-noise amplifier is demonstrated through circuit simulations.

Figure 8A:
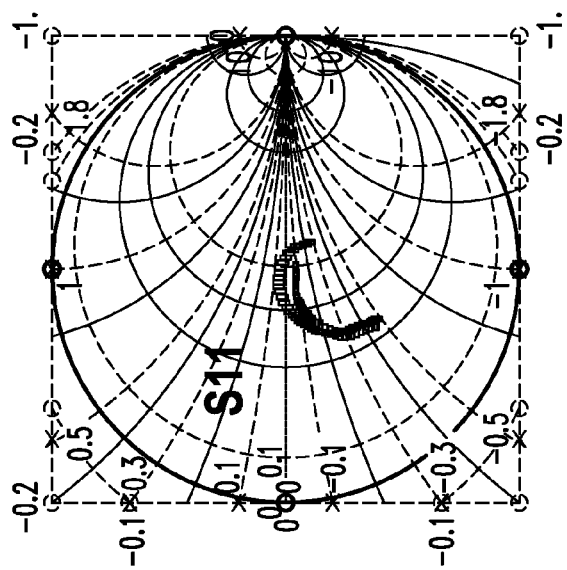
FIG. 8 shows a simulated gain, input match, noise figure, and output match of the exemplary variable-gain amplifier shown in FIG. 4.
Figure 8B:
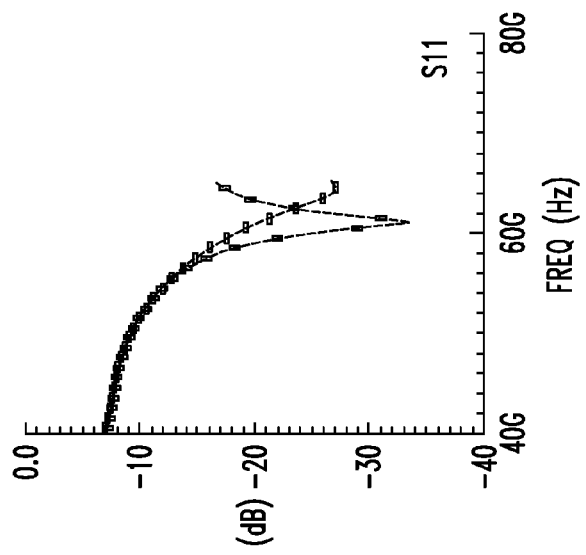
Figure 8C:
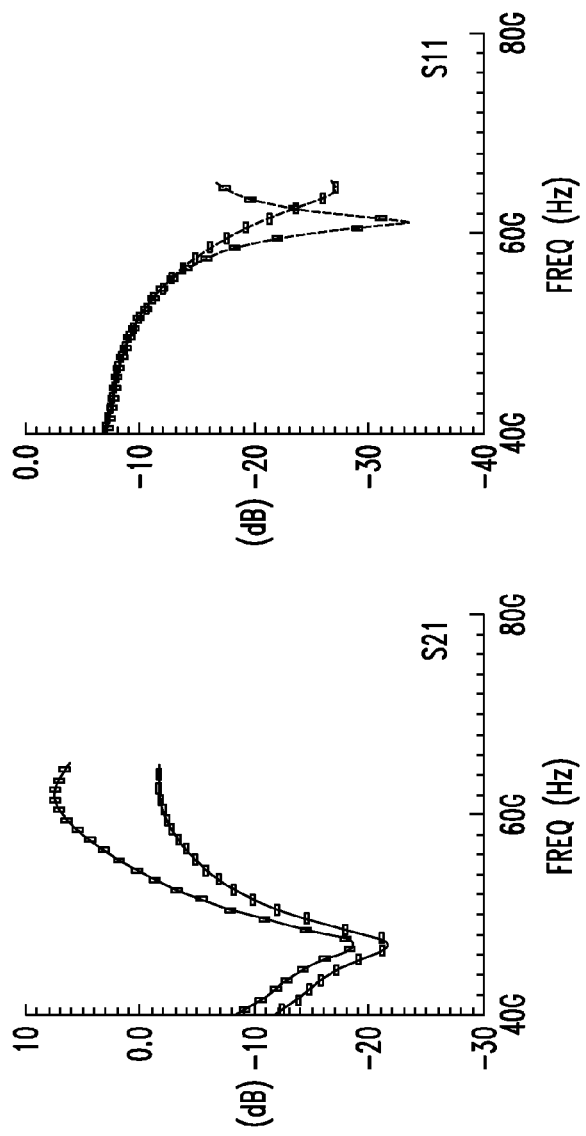

FIG. 8(a) shows the simulated S21 indicating a gain step between high-gain and low-gain modes of approximately 9 dB at 60 GHz. FIGS. 8(b) and (c) show the simulated S11 in rectangular and Smith-chart coordinates, indicating that the input return loss is better than 10 dB in both high-gain and low-gain modes. Also, the overlap of S11 in FIG. 8(c) shows how little the input match varies between high-gain and low-gain modes. FIG. 8(d) shows the simulated noise figure of the exemplary low-noise amplifier in high-gain and low-gain modes, indicating that the noise figure in low-gain mode is approximately 9 dB higher than the noise figure in high-gain mode. FIGS. 8(e) and (f) show the simulated S22 in rectangular and smith-chart coordinates, indicating that the output return loss is better than 10 dB in both high-gain and low-gain modes. From the Smith chart in FIG. 8(f), one can see that S22 does vary between high-gain and low-gain modes; however, the difference is contained such that the return loss in both modes is acceptable.

At least a portion of the circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Figure 9:
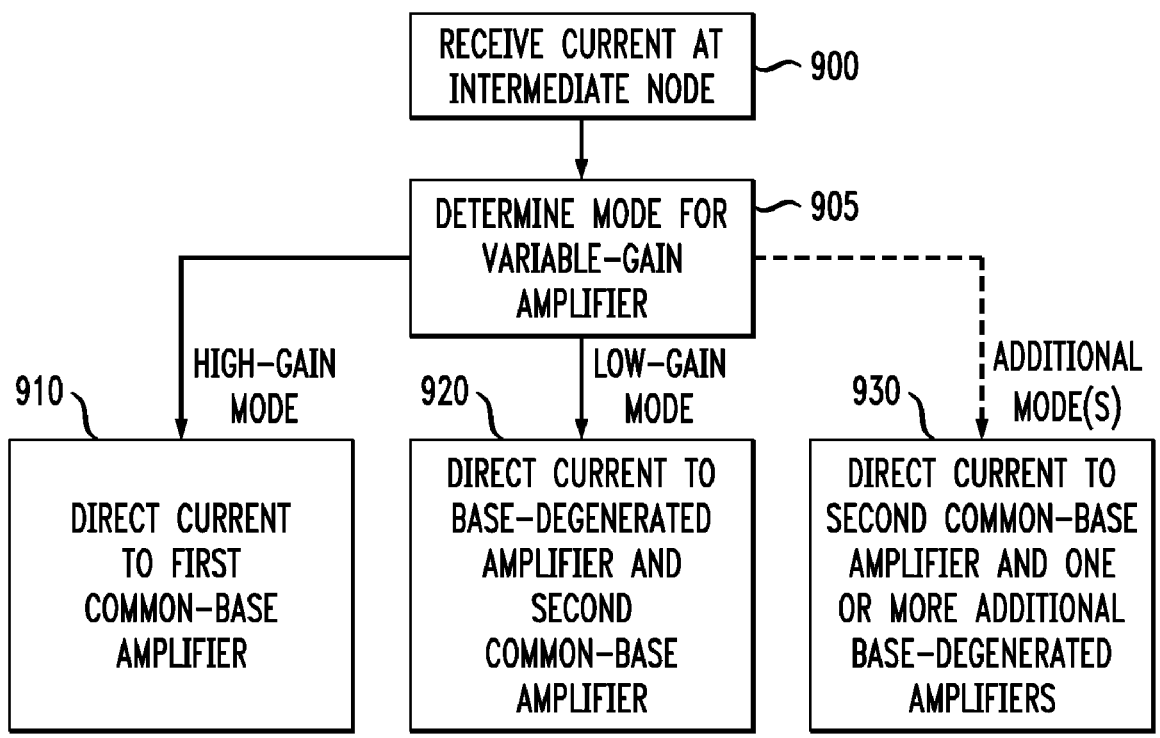
FIG. 9 is a simplified flow diagram showing an exemplary method of operating a variable-gain amplifier according to an illustrative embodiment of the present invention.

FIG. 9 shows a simplified flow diagram of an exemplary method of operating a variable-gain amplifier according to an illustrative embodiment of the present invention. Preferably, this variable-gain amplifier is similar to those described above with reference to FIGS. 4-7. The method begins in step 900 with the receipt of an electric current at an intermediate node. In step 905, a determination is made regarding in which one of a plurality of modes the variable-gain amplifier should operate. If a determination is made that the amplifier should operate in a high-gain mode, the method continues in step 910 and the electric current is directed from the intermediate node to a first common-base amplifier having an emitter electrically connected to the intermediate node and a collector electrically connected to an output node.

If a determination is made that the amplifier should operate in a low-gain mode, the method continues in step 920 and the electric current is directed from the intermediate node to a base-degenerated amplifier and a second common-base amplifier. The base-degenerated amplifier has an emitter electrically connected to the intermediate node and a collector electrically connected to the output node. The second common-base amplifier has an emitter electrically connected to the intermediate node and a collector electrically connected to small-signal ground.

Optionally, one or more additional modes may be implemented by the variable-gain amplifier, as described above with reference to FIG. 6. If a determination is made that the variable-gain amplifier should operate in a given one of these one or more additional modes, the method proceeds to step 930, in which current is directed from the intermediate node to the second common-base amplifier and one or more additional base-degenerated amplifiers electrically connected to the intermediate node.

Figure 10:
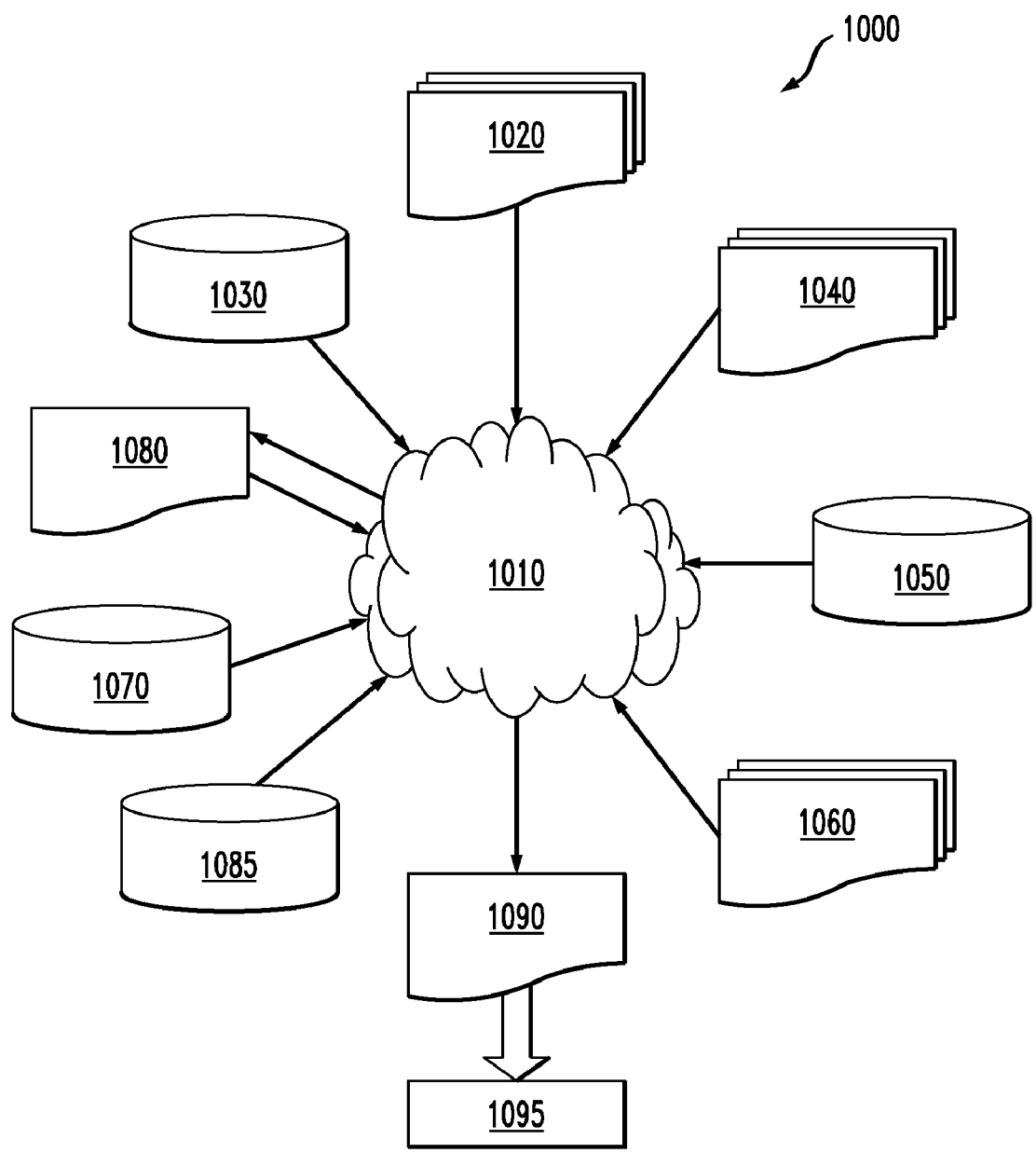
FIG. 10 is a flow diagram of a design process used in semiconductor design, manufacture, and/or test.

FIG. 10 shows a block diagram of an exemplary design flow 1000 used for example, in semiconductor design, manufacturing, and/or test. Design flow 1000 may vary depending on the type of integrated circuit (IC) being designed. For example, a design flow 1000 for building an application specific IC (ASIC) may differ from a design flow 1000 for designing a standard component. Design structure 1020 is preferably an input to a design process 1010 and may come from an IC provider, a core developer, or other design company or may be generated by the operator of the design flow, or from other sources. Design structure 1020 comprises an embodiment of the invention as shown in one or more of FIGS. 4-7 in the form of schematics or HDL, a hardware-description language (e.g., Verilog, VHDL, C, etc.). Design structure 1020 may be contained on one or more machine readable medium. For example, design structure 1020 may be a text file or a graphical representation of an embodiment of the invention as shown in one or more of FIGS. 4-7. Design process 1010 preferably synthesizes (or translates) an embodiment of the invention as shown in one or more of FIGS. 4-7 into a netlist 1080, where netlist 1080 is, for example, a list of wires, transistors, logic gates, control circuits, I/O, models, etc. that describes the connections to other elements and circuits in an integrated circuit design and recorded on at least one of machine readable medium. This may be an iterative process in which netlist 1080 is resynthesized one or more times depending on design specifications and parameters for the circuit.

Design process 1010 may include using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 100 nm, etc.), design specifications 1040, characterization data 1050, verification data 1060, design rules 1070, and test data files 1085 (which may include test patterns and other testing information). Design process 1010 may further include, for example, standard circuit design processes such as timing analysis, verification, design rule checking, place and route operations, etc. One of ordinary skill in the art of integrated circuit design can appreciate the extent of possible electronic design automation tools and applications used in design process 1010 without deviating from the scope and spirit of the invention. The design structure of the invention is not limited to any specific design flow.

Design process 1010 preferably translates an embodiment of the invention as shown in one or more of FIGS. 4-7, along with any additional integrated circuit design or data (if applicable), into a second design structure 1090. Design structure 1090 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 1090 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in one or more of FIGS. 4-7. Design structure 1090 may then proceed to a stage 1095 where, for example, design structure 1090: proceeds to tape-out, is released to manufacturing, is released to a mask house, is sent to another design house, is sent back to the customer, etc.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A variable-gain amplifier comprising:
   an intermediate node operative to receive an electric current;
   a common-emitter amplifier having a collector electrically connected to the intermediate node;
   a first common-base amplifier having an emitter electrically connected to the intermediate node and a collector electrically connected to an output node;
   a base-degenerated amplifier having an emitter electrically connected to the intermediate node and a collector electrically connected to the output node;
   a second common-base amplifier having an emitter electrically connected to the intermediate node and a collector electrically connected to small-signal ground;
   wherein the intermediate node is operative to direct the electric current to the first common-base amplifier, thereby causing the variable-gain amplifier to operate in a first mode; and
   wherein the intermediate node is operative to direct the electric current to the base-degenerated amplifier and the second common-base amplifier, thereby causing the variable-gain amplifier to operate in a second mode.

2. The amplifier of claim 1, wherein the first mode is characterized by a higher gain than the second mode.

3. The amplifier of claim 1, wherein the variable-gain amplifier is a low-noise amplifier.

4. The amplifier of claim 1, further comprising:
   a first capacitor electrically connected to a base node of the first common-base amplifier;
   a second capacitor electrically connected to a base node of the base-degenerated amplifier; and
   a third capacitor electrically connected to a base node of the second common-base amplifier;
   wherein the first and third capacitors have a capacitance substantially greater than the second capacitor.

5. The amplifier of claim 4, wherein the second capacitor is in series with the base-emitter capacitance of the base-degenerated amplifier.

6. The amplifier of claim 4, wherein the second capacitor has a variable capacitance.

7. The amplifier of claim 1, further comprising a current source electrically connected to the intermediate node, operative to direct current into the amplifier in the second mode and disabled in the first mode.

8. The amplifier of claim 7, wherein the current source is a transistor in a common emitter configuration.

9. The amplifier of claim 7, wherein the current source is matched in size to the first common-base amplifier.

10. The amplifier of claim 1, further comprising a notch filter electrically connected to the intermediate node, the notch filter comprising a capacitor electrically connected in parallel with an open-circuited transmission line.

11. The amplifier of claim 10, wherein the notch filter exhibits a series resonance when the variable-gain amplifier is operating in the first mode and a parallel resonance when the variable-gain amplifier is operating in the second mode.

12. The amplifier of claim 10, wherein the transmission line has a notch frequency of one-half wavelength.

13. The amplifier of claim 1, further comprising one or more additional base-degenerated amplifiers electrically connected to the intermediate node;
   wherein the intermediate node is operative to direct current to the second common-base amplifier and the one or more additional base-degenerated amplifiers, thereby causing the variable-gain amplifier to operate in one or more additional modes.

14. The amplifier of claim 13, wherein the intermediate node is operative to direct current to at least a given one of the one or more additional base-degenerated amplifiers, thereby causing the variable-gain amplifier to operate in at least a given one of the one or more additional modes.

15. The amplifier of claim 1, wherein the first common-base amplifier provides a first parasitic capacitance when the variable-gain amplifier is operating in the first mode;
wherein the second common-base amplifier provides a second parasitic capacitance when the variable-gain amplifier is operating in the second mode; and
wherein the first parasitic capacitance and the second parasitic capacitance are equal.

16. The amplifier of claim 1, wherein the output node is electrically connected to an output-matching network.

17. The amplifier of claim 1, further comprising a third common-base amplifier in series between the output node and the coupled collectors of the first common-base amplifier and the base-degenerated amplifier.

18. A receiver comprising at least one variable-gain amplifier, each variable-gain amplifier comprising:
an intermediate node operative to receive an electric current from a current source;
a common-emitter amplifier having a collector electrically connected to the intermediate node;
a first common-base amplifier having an emitter electrically connected to the intermediate node and a collector electrically connected to an output node;
a base-degenerated amplifier having an emitter electrically connected to the intermediate node and a collector electrically connected to the output node;
a second common-base amplifier having an emitter electrically connected to the intermediate node and a collector electrically connected to small-signal ground;
wherein the intermediate node is operative to direct the electric current to the first common-base amplifier, thereby causing the variable-gain amplifier to operate in a first mode; and
wherein the intermediate node is operative to direct the electric current to the base-degenerated amplifier and the second common-base amplifier, thereby causing the variable-gain amplifier to operate in a second mode.

19. The receiver of claim 18, wherein the receiver comprises a plurality of variable-gain amplifiers connected in series, each variable-gain amplifier comprising:
an intermediate node operative to receive an electric current from a current source;
a common-emitter amplifier having a collector electrically connected to the intermediate node;
a first common-base amplifier having an emitter electrically connected to the intermediate node and a collector electrically connected to an output node;
a base-degenerated amplifier having an emitter electrically connected to the intermediate node and a collector electrically connected to the output node;
a second common-base amplifier having an emitter electrically connected to the intermediate node and a collector electrically connected to small-signal ground;
wherein the intermediate node is operative to direct the electric current to the first common-base amplifier, thereby causing the variable-gain amplifier to operate in a first mode; and
wherein the intermediate node is operative to direct the electric current to the base-degenerated amplifier and the second common-base amplifier, thereby causing the variable-gain amplifier to operate in a second mode.

20. A design structure embodied in a machine readable medium, the design structure comprising a variable-gain amplifier, the variable-gain amplifier comprising:
an intermediate node operative to receive an electric current from a current source;
a common-emitter amplifier having a collector electrically connected to the intermediate node;
a first common-base amplifier having an emitter electrically connected to the intermediate node and a collector electrically connected to an output node;
a base-degenerated amplifier having an emitter electrically connected to the intermediate node and a collector electrically connected to the output node;
a second common-base amplifier having an emitter electrically connected to the intermediate node and a collector electrically connected to small-signal ground;
wherein the intermediate node is operative to direct the electric current to the first common-base amplifier, thereby causing the variable-gain amplifier to operate in a first mode; and
wherein the intermediate node is operative to direct the electric current to the base-degenerated amplifier and the second common-base amplifier, thereby causing the variable-gain amplifier to operate in a second mode.

21. A method of operating a variable-gain amplifier comprising the steps of:
receiving an electric current at an intermediate node;
determining one of a plurality of modes in which the variable-gain amplifier should operate;
responsive to a determination that the variable-gain amplifier should operate in a first mode, directing the electric current from the intermediate node to a first common-base amplifier, the first common-base amplifier having an emitter electrically connected to the intermediate node and a collector electrically connected to an output node;
responsive to a determination that the variable-gain amplifier should operate in a second mode, directing the electric current from the intermediate node to a base-degenerated amplifier and a second common-base amplifier, the base-degenerated amplifier having an emitter electrically connected to the intermediate node and a collector electrically connected to the output node and the second common-base amplifier having an emitter electrically connected to the intermediate node and a collector electrically connected to small-signal ground.

22. The method of claim 21, wherein the first mode is characterized by a higher gain than the second mode.

23. The method of claim 21, further comprising a step of:
responsive to a determination that the variable-gain amplifier should operate in a given one of one or more additional modes, directing current from the intermediate node to the second common-base amplifier and one or more additional base-degenerated amplifiers electrically connected to the intermediate node.

* * * * *